United States Patent
Harrington et al.

(10) Patent No.: US 6,326,275 B1
(45) Date of Patent: Dec. 4, 2001

(54) DRAM CELL WITH VERTICAL CMOS TRANSISTOR

(75) Inventors: Jay G. Harrington, Wappingers Falls, NY (US); David V. Horak, Essex Junction, VT (US); Kevin M. Houlihan, Wappingers Falls, NY (US); Chung Hon Lam, Williston, VT (US); Rebecca D. Mih, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/559,363

(22) Filed: Apr. 24, 2000

(51) Int. Cl.⁷ .................. H01L 21/20; H01L 21/8242
(52) U.S. Cl. .................. 438/386; 438/387; 438/388; 438/243; 438/244; 438/245
(58) Field of Search ................... 438/243–245, 438/248, 386–388, 391

(56) References Cited

U.S. PATENT DOCUMENTS

| | | | |
|---|---|---|---|
| 5,422,294 | * 6/1995 | Noble, Jr. ................ | 438/246 |
| 5,593,912 | * 1/1997 | Rajeevakumar ........... | 438/696 |
| 5,656,544 | * 8/1997 | Bergendahl et al. ....... | 438/386 |
| 5,844,266 | * 12/1998 | Stengl et al. ............. | 257/301 |
| 5,877,061 | * 3/1999 | Halle et al. ............... | 438/386 |
| 6,074,909 | * 6/2000 | Gruening ................. | 438/242 |
| 6,117,726 | * 9/2000 | Tsai et al. ................ | 438/242 |
| 6,140,175 | * 10/2000 | Kleinhenz et al. ......... | 438/243 |
| 6,200,851 | * 3/2001 | Arnold .................... | 438/243 |
| 6,200,873 | * 3/2001 | Schrems et al. .......... | 438/386 |
| 6,211,006 | * 4/2001 | Tsai et al. ................ | 438/246 |
| 6,236,079 | * 5/2001 | Nitayama eet al. ........ | 257/306 |
| 6,251,722 | * 6/2001 | Wei et al. ................ | 438/243 |

* cited by examiner

Primary Examiner—Eddie Lee
Assistant Examiner—José R Díaz
(74) Attorney, Agent, or Firm—Eric W. Petraske

(57) ABSTRACT

A DRAM memory cell having a trench capacitor includes a vertical pass transistor formed in the top of the trench in a process that forms a doped poly protective layer on the upper sidewalls above a sacrificial intrinsic poly spacer layer, the doped poly protecting the sidewalls while the intrinsic poly spacer layer is removed and replaced with a conductive strap layer that both forms a strap from the capacitor electrode and serves as a source of dopant to form a transistor electrode in the silicon substrate; the protective layer and the upper portion of the strap material being removed simultaneously so that no extra step is required; after which the trench walls are oxidized to form the transistor gate dielectric and conductive material is deposited to form the wordline and the gates for the vertical transistors simultaneously.

8 Claims, 2 Drawing Sheets

DRAM CELL WITH VERTICAL CMOS TRANSISTOR

FIELD OF THE INVENTION

The field of the invention is integrated circuit processing, in particular circuits containing a DRAM array employing trench capacitors.

BACKGROUND OF THE INVENTION

In DRAMs and embedded DRAMs, the art has constantly sought to decrease the size of the one-transistor one-capacitor cell. Cells that place the transistor on the wall of a trench capacitor have been tried but without success. Among other problems, the transistor is quite leaky, which is unacceptable in DRAMs.

SUMMARY OF THE INVENTION

The invention relates to a method of forming a DRAM cell with an integrated vertical transistor.

A feature of the invention is the deposition of a protective doped poly layer on the trench walls that protects the walls during buried strap formation.

Another feature of the invention is the simultaneous removal of the protective layer and the filler material in the trench, thereby avoiding the need for an extra removal step.

DESCRIPTION OF THE PREFERRED EMBODIMENT

Figure 1:
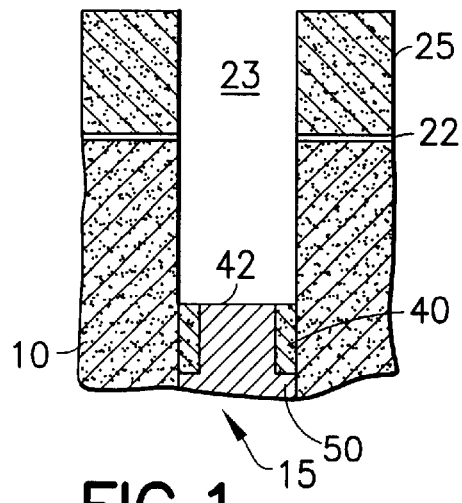
FIGS. 1 through 8 show the process for forming a DRAM cell at various stages.

FIG. 1 shows the top portion of a DRAM cell formed in substrate 10 and using a trench capacitor denoted by the numeral 15. The lower portion, containing the capacitor electrode is conventional and well known in the art. Polysilicon (poly) 50 is doped n-type and is the inner electrode of the capacitor. At the top of the capacitor, oxide collar 40 isolates the center electrode from the substrate walls. The common surface at the top of oxide collar 40 and center electrode 50 will be referred to as the capacitor top surface 42. At the silicon surface, (the surface of substrate 10), pad oxide 22 is positioned below top dielectric layer 25 (illustratively 150 nm of nitride). The thickness of nitride 25 should be great enough so that sidewalls to be formed in a later step will isolate the wordline material that will be deposited in the nitride aperture 23 above the trench from a bitline that will be positioned close to the wordline.

Figure 2:
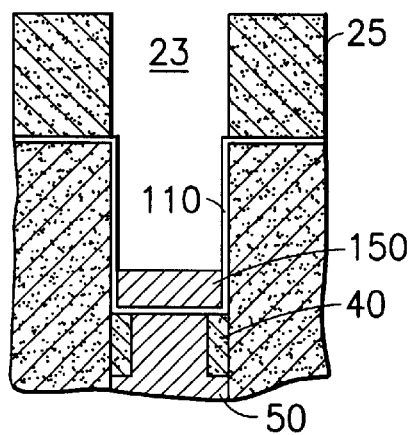

Referring now to FIG. 2, the walls of aperture 23 at the top of the trench (referred to as the vertical silicon walls) have been oxidized to a thickness of about 8 nm to form a vertical dielectric layer 110 and a horizontal spacer layer of intrinsic poly 150 has been deposited on the capacitor top surface and then recessed, illustratively to a thickness of about 150 nm. Preferably, the intrinsic poly is non-conformal, but if some adheres to the aperture walls it is removed in a conventional isotropic dry etch (e.g. in SF6 chemistry) step. Poly 150 serves temporarily to define the space that will be filled by the conductive strap that connects the capacitor to the pass transistor.

Figure 3:
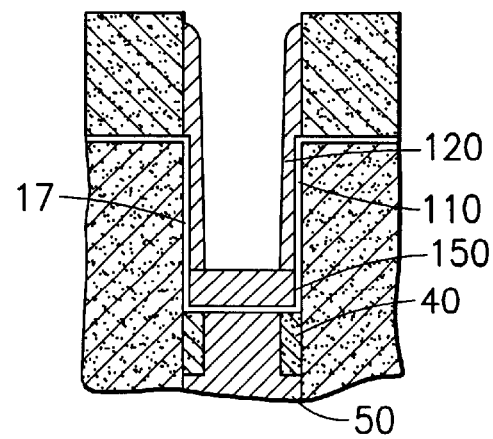
Figure 4:
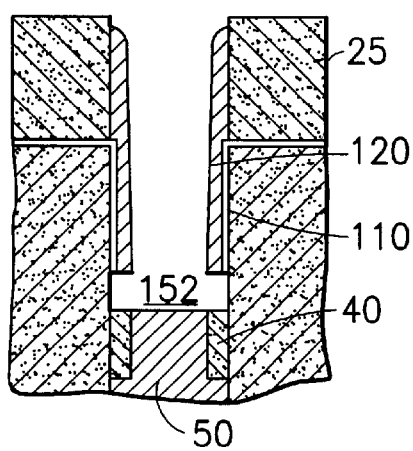

Next, as shown in FIG. 3, a layer of P+ poly is conformally deposited to a depth of about 30 nm on the vertical walls and etched in a conventional directional reactive ion etching (RIE) step using chlorine or bromine based chemistry to remove the horizontal material at the bottom of the trench, leaving a vertical protective layer 120. Spacer layer 150 is removed selective to protective layer 120 and the underlying oxide layer 110 in a KOH/Alcohol (preferably Benzol Alcohol for best selectivity) solution. A BHF oxide strip followed to remove the portion of layer 110 exposed by the etched spacer layer 150. The result is shown in FIG. 4.

Figure 5:
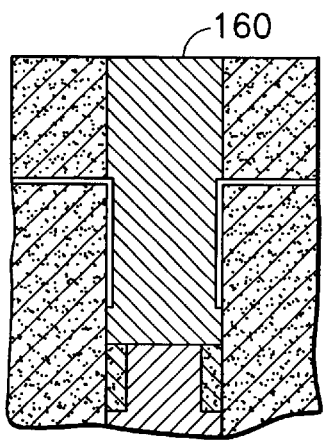

Referring to FIG. 5, the trench is re-filled with a layer of moderately arsenic doped n-type poly 160, the bottom portion of which forms a conductive strap layer in the space 152 left by spacer layer 150.

Figure 6:
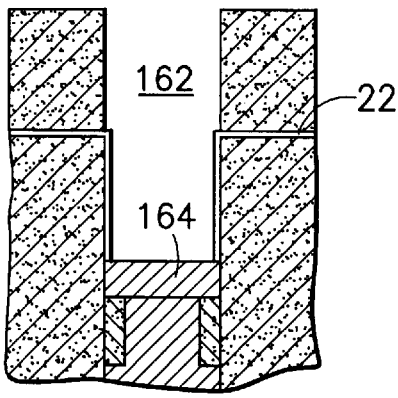

In FIG. 6, the result of recessing both the doped poly 160 and the intrinsic poly 120 leaves aperture 162 and strap 164. The recess etch can be accomplished with a conventional reactive ion etch with chlorine or bromine based chemistry followed by a brief isotropic SF6 etch to clean up the side wall. The recess is controlled by time to a depth no less than the original intrinsic polysilicon spacer 150 shown in FIG. 2.

This step has the cost advantage that no extra stripping operation is required to remove the protective poly 120. The trench wall is preserved against all the reactive ion etching damages up to this point by the sacrificial oxide layer 110.

The trench walls are next prepared for the growth of the gate dielectric for the vertical transistors by another conventional HF dip and growing a gate oxide 112 on the vertical walls and on the top of strap 164 to a thickness of 8 to 6 nm. The trench is filled with its last material —conductive wordline material (N or P doped poly 170) that is planarized, illustratively by a conventional chemical-mechanical polishing step stopping on the top surface of nitride 25. Poly 170 forms the gate of the vertical transistor, being insulated from strap 164 by oxide 112 on the top surface of the strap.

Figure 8:
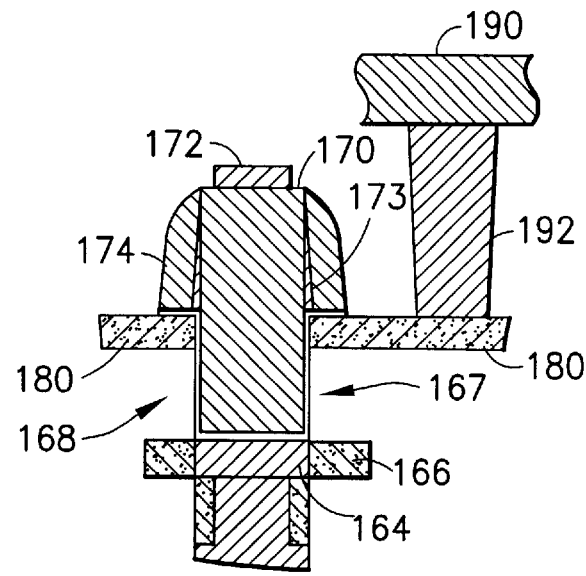

Finishing steps include stripping nitride 25, implanting source/drain implants 180 in the silicon surface, annealing the implants (which also diffuses dopant from strap 164 into the adjacent silicon to form the other electrode of the vertical transistor), growth of 6 nm thermal oxide 173 and 100 nm nitride 174 spacers to insulate wordline 170, deposition and patterning of bitline contact 192 extending upward to make contact with bitline 190, and formation of titanium or cobalt silicide 172 on top of wordline 170 and also in the area of electrodes 180. The result is shown in FIG. 8, with a vertical transistor 168 formed all around the trench (left and right in the Figure and both before and behind the plane of the Figure) having S/D areas 180 just below the surface and electrode 166 adjacent strap 164, the two electrodes being connected by channel 167. The lower portion of wordline 170 below the silicon surface forms the gate of this vertical transistor. Wordline 170 extends perpendicular to the plane of the paper, deposited on the silicon surface (and insulated from the silicon surface). Bitline 190 extends left to right.

Figure 7:
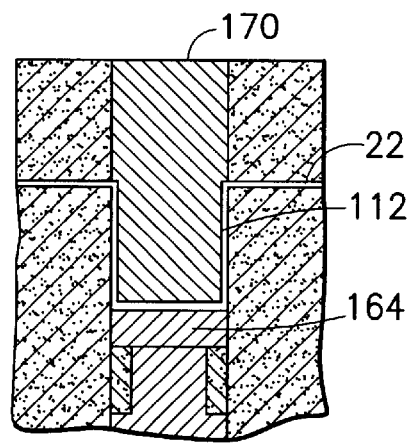

Those skilled in the art will appreciate that FIGS. 2, 5 and 7 show the results of CMP operations, stopping on nitride 25. It is not essential that these be done at the times shown in this set of figures and two or more might be combined, so long as the final result gives a wordline 170 of the correct height (i.e. coplanar with the top of nitride 25). Further, the materials used in all embodiments of the invention are not necessarily those listed here, so long as the relative selectivity is maintained.

While the invention has been described in terms of a single preferred embodiment, those skilled in the art will recognize that the invention can be practiced in various versions within the spirit and scope of the following claims.

We claim:

1. A method of forming a memory cell comprising the steps of:

forming a trench capacitor in a silicon substrate having a top dielectric layer deposited thereon, said trench capacitor having a capacitor top surface recessed a first distance below a silicon surface of said substrate, whereby vertical silicon walls in a transistor trench separate said capacitor top surface from said silicon surface;

forming a vertical dielectric layer on said vertical silicon walls;

forming a spacer layer above said capacitor top surface within said transistor trench;

forming a protective layer on said vertical dielectric layer above said spacer layer different in composition from said vertical dielectric layer and from said spacer layer;

stripping said spacer layer;

forming a conductive strap layer in place of said spacer layer by depositing a conductive material within said trench and stripping both said conductive material and said protective layer;

stripping said vertical dielectric layer;

forming a vertical gate dielectric layer on said vertical silicon walls; and depositing a conductive wordline material in said trench adjacent said vertical gate dielectric, thereby forming a gate for a vertical transistor.

2. A method according to claim 1, in which said spacer layer is formed from intrinsic polysilicon and said protective layer is formed from doped polysilicon.

3. A method according to claim 1, in which said strap layer is formed from arsenic-doped polysilicon.

4. A method according to claim 2, in which said strap layer is formed from arsenic-doped polysilicon.

5. A method according to claim 2, in which said steps of stripping said conductive material and stripping said protective layer are performed simultaneously.

6. A method according to claim 3, in which said steps of stripping said conductive material and stripping said protective layer are performed simultaneously.

7. A method according to claim 1, further including the steps of:

forming a wordline aperture in said top dielectric layer connecting a plurality of memory cells and making contact with said trench;

depositing said conductive wordline material in said wordline aperture and in said trench simultaneously, thereby forming a wordline and a set of gates for said vertical transistors simultaneously.

8. A method according to claim 7, further including the steps of:

removing said top dielectric, thereby leaving a projecting portion of said conductive wordline material extending above said silicon substrate;

forming sidewalls on said projecting portion of said conductive wordline material;

implanting said silicon substrate, thereby forming a first electrode of said vertical capacitors; and annealing said silicon substrate, whereby dopant diffuses out from said conductive strap layer into said silicon substrate, thereby forming a second electrode of said vertical transistors.

* * * * *